United States Patent
Nalawade et al.

(10) Patent No.: US 8,779,818 B2
(45) Date of Patent: Jul. 15, 2014

(54) OPTIMIZING PRE-DRIVER CONTROL FOR DIGITAL INTEGRATED CIRCUITS

(71) Applicant: Texas Instruments Incorporated, Dallas, TX (US)

(72) Inventors: Prasad Nalawade, Bangalore (IN); Vinayak Ghatawade, Bangalore (IN)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 13/670,409

(22) Filed: Nov. 6, 2012

(65) Prior Publication Data
US 2014/0125388 A1 May 8, 2014

(51) Int. Cl.
H03K 5/12 (2006.01)

(52) U.S. Cl.
CPC .............................. H03K 5/12 (2013.01)

USPC .......................................... 327/170; 327/108

(58) Field of Classification Search
None
See application file for complete search history.

(56) References Cited

U.S. PATENT DOCUMENTS

| 6,222,403 B1* | 4/2001 | Mitsuda ................. 327/170 |
| 8,519,761 B1* | 8/2013 | Kossel et al. .......... 327/170 |
| 2006/0284658 A1* | 12/2006 | Wright ................. 327/170 |
| 2010/0073059 A1* | 3/2010 | Chae et al. ............ 327/175 |

* cited by examiner

*Primary Examiner* — Cassandra Cox
(74) *Attorney, Agent, or Firm* — John R. Pessetto; Frederick J. Telecky, Jr.

(57) ABSTRACT

Disclosed is a wave shaping apparatus and a method for shaping an input pulse train signal alternating between a low level and a high level to provide a signal delaying a turn on of one output transistor with respect to a turn off of the other output transistor thus decreasing time, when both the transistors would be simultaneously conducting current.

18 Claims, 3 Drawing Sheets

US 8,779,818 B2

OPTIMIZING PRE-DRIVER CONTROL FOR DIGITAL INTEGRATED CIRCUITS

FIELD

The present disclosure relates to digital integrated circuits, and, more particularly, to a method and an apparatus for optimizing a pre-driver control for such digital integrated circuits.

BACKGROUND

A person skilled in the art will appreciate that the concepts disclosed herein are applicable to digital integrated circuits (IC), examples of which include, but are not limited to Low Voltage Complementary Metal Oxide Semiconductors (LVCMOS), Low Voltage Transistor-Transistor Logic (LVTTL), High-Speed Transceiver Logic (HSTL), Stub Series Terminated Logic (SSTL), and the like.

One of the challenges in design of output circuitry of digital ICs is satisfying current and voltage requirements dictated by a load connected to the output circuitry, while at the same time achieving a high maximum frequency (Fmax) and low delay of the signal processed by the digital IC. In general, a signal processed by digital ICs comprises a pulse train of a generally variable duty cycle. An ideal pulse train alternates instantaneously between two levels—a low level and a high level, represented by, for example, voltage or current. The up and down transitions between the low level high levels are called the rising edge and the falling edge. The duty cycle, i.e., length of time spent at the low levels and time spent at the high level varies and is determined by the information carried by the signal.

In practice, the instantaneous alternation is never achieved because of physical limitations of the system that generates the waveform. The times taken for the signal to rise from a low level to a high level and back again are called the "rise time" and the "fall time" respectively. The term "rise time" refers to the time required for the signal to change from a specified value of the low level to a specified value of the high level, and the term "fall time" refers to the time required for the signal to change from the specified value of the high level to the specified value of the low level. In other words, the rise time is the time required for the response to rise from x % to y % of its final value. Often the specified values are 10% and 90% of the difference between the high level and the low level.

A conceptual output circuitry 100 as known in the art is illustrated in FIG. 1. A signal to be processed by the output circuitry 100 originates inside of the IC and is conceptually depicted as a signal source 102. In general signal to be processed comprises data. The signal is provided to an input of a pre-driver 104. The task of the pre-driver 104 is to properly condition the signal, i.e., to provide a signal with a proper shape to an output driver 106. The task of the, output driver 106 is to amplify the signal to satisfying current and voltage requirements dictated by a load 108.

FIG. 2 illustrates further details of possible implementation of conceptual block diagram of FIG. 1. By means of example, the topology of the driver 106 of FIG. 1 may comprise a pair of P-Channel MOS transistor 206a and an N-channel MOS transistor 206b as depicted in FIG. 2 When such an output stage is driven by a signal form the pre-driver 204, there is a certain period of time, when both the P-channel MOS transistor 206a, and the N-channel MOS transistor 206b would be simultaneously "ON", i.e., the transistors are simultaneously conducting a current for a certain period of time. Such a current is known as crowbar current (Icrowbar) flowing through both of the transistors. The crowbar current causes voltage change at the power supply $V_{DDS}$ and $V_{SS}$ and power ground nodes (not shown); which in turn causes degradation of the signal.

Because of the finite frequency response of the P-channel MOS transistor 206a and the N-channel MOS transistor 206b decreasing the rise time respectively the fall time of the single signal would not prevent both the P-channel MOS transistor 206a, and the N-channel MOS transistor 206b to be ON for a certain period of time. Furthermore, decreasing the rise time respectively the fall time causes a derivative of current with time (di/dt) to increase. Such increase of di/dt further contributes to voltage change at the power supply and power ground nodes.

An improvement on the single signal solution known in the art modified the pre-driver 104 to comprise a not-AND (NAND) circuit 204a configured so that the falling edge of the NAND voltage signal turns on the P-channel MOS transistor 206a and a not-OR (NOR) circuit 204b configured so that the falling edge of the NOR voltage signal turns on the N-channel MOS transistor 206b. The inclusion of the NAND 204a and NOR 204b circuitry caused the shaping of the signal driving the P-channel MOS transistor 206a and the N-channel MOS transistor 206b to turn on at slightly different times; consequently decreasing the time when both the P-channel MOS transistor 206a, and the N-channel MOS transistor 206b are ON; thus decreasing the di/dt as well as the crowbar current. Such improvement is due to asymmetry between the turn on and turn off times of the NAND 204a and NOR 204b circuits—the falling edge of the output voltage of the NAND circuit 204a is slower than the falling edge of the output voltage of the NOR circuit 204b, while the rising edge of the output voltage of the NAND circuit 204a is faster than the rising edge of the output voltage of the NOR circuit 204b.

As illustrated in FIG. 2, although not always implemented, the pre-driver circuit comprising the NAND 204a and NOR 204b circuitry is provided with the signal to be processed 202 as well as a control signal 201, which enables and disables the at the pre-driver circuit 204 processing of the signal by the output circuitry 200.

However, there is a need in the art for a further improvement in the decrease of the di/dt as well as the crowbar current.

SUMMARY

In one aspect of the disclosure, a wave shaping circuitry is interposed between the conventional pre-driver and the output driver according to appended independent claims is disclosed. Preferred additional aspects are disclosed in the dependent claims.

BRIEF DESCRIPTION OF THE DRAWINGS

The foregoing aspects described herein will become more readily apparent by reference to the following description when taken in conjunction with the accompanying drawings wherein.

DETAILED DESCRIPTION

Figure 1:
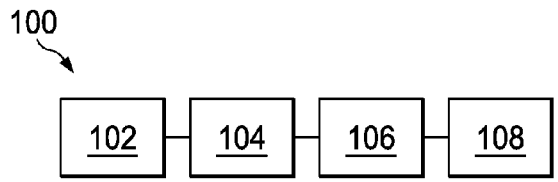
FIG. 1 depicts a conceptual structure of an exemplary output circuitry in accordance with known concepts.
Figure 2:
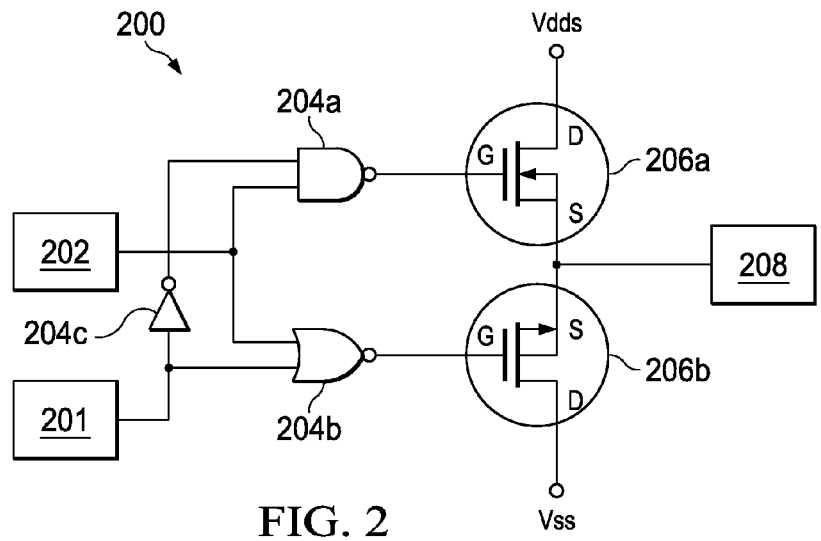
FIG. 2 depicts further details of an exemplary implementation of the exemplary output circuitry in accordance with known concepts.

Various aspects of the present invention will be described herein with reference to drawings that are schematic illustrations of idealized configurations of the present invention. As such, variations from the shapes of the illustrations as a result, for example, manufacturing techniques and/or tolerances, are to be expected. Thus, the various aspects of the present invention presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Various disclosed aspects may be illustrated with reference to one or more exemplary configurations. As used herein, the term "exemplary" means "serving as an example, instance, or illustration," and should not necessarily be construed as preferred or advantageous over other configurations disclosed herein.

One of the possible topology implementing the above-described functionality is depicted in FIG. 3.

Figure 3A:
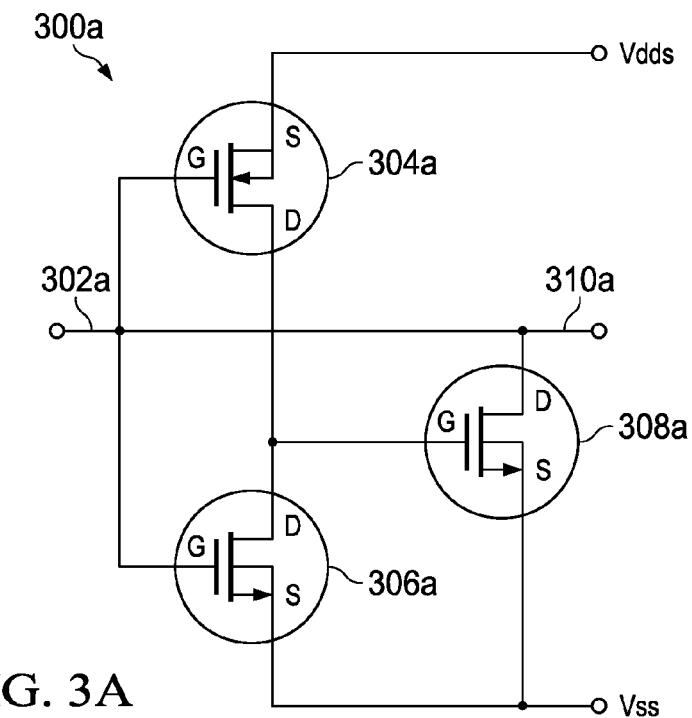
FIG. 3A depicts a conceptual structure of an exemplary wave shaping circuitry interposed between a NAND circuit and a P-channel MOS transistor in accordance with an aspect of this disclosure.

The wave shaping circuitry 300a interposed between a NAND circuit (not shown) and a P-channel MOS transistor (not shown) is depicted in FIG. 3A. An output of a NAND circuit (not shown) is connected to an input 302a, to gates G of transistors 304a and 306a, and to a drain D of transistor 308a. A source S of the transistor 304a is connected to a first voltage $V_{DDS}$, and a drain D is connected to a drain D of the transistor 306a. A source S of the transistor 306a is connected to a second voltage $V_{SS}$. The first voltage $V_{DDS}$ has a positive potential in respect to the second voltage $V_{SS}$. A gate G of a transistor 308a is connected to the drains D of the transistors 304a and 306a, and source of the transistor 308a is connected to the second voltage $V_{SS}$. An output 310a, which is an input of a P-channel MOS transistor (not shown), is taken from the common point of the input 302a, the gates G of transistors 304a and 306a, and the drain D of transistor 308a.

Figure 3B:
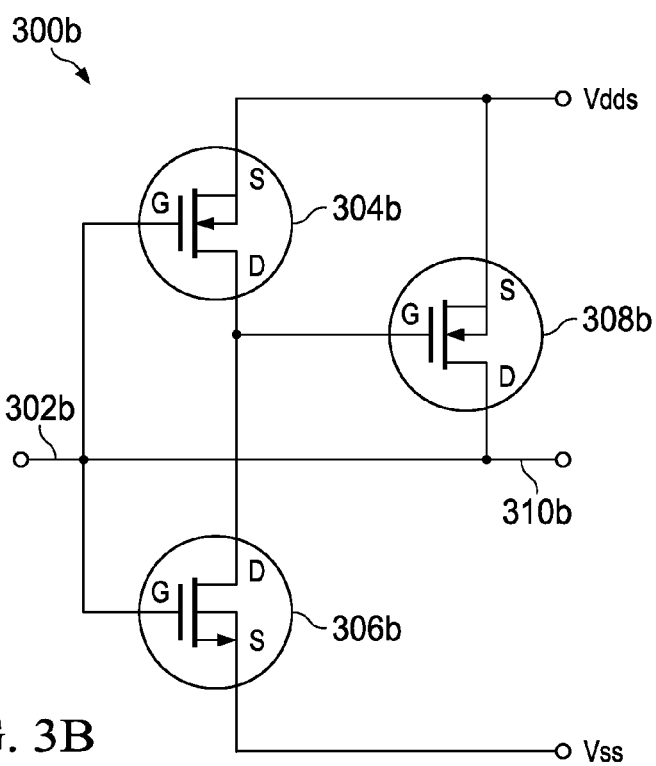
FIG. 3B depicts a conceptual structure of an exemplary wave shaping circuitry interposed between a NOR circuit and an N-channel MOS transistor in accordance with an aspect of this disclosure.

Similarly, the wave shaping circuitry 300b interposed between a NOR circuit (not shown) and an N-channel MOS transistor (not shown) is depicted in FIG. 3B. An output of a NOR circuit (not shown) is connected to an input 302b, to gates G of transistors 304b and 306b, and to a drain D of transistor 308b. A source S of the transistor 304b is connected to a first voltage $V_{DDS}$, and a drain D is connected to a drain D of the transistor 306b. A source S of the transistor 306b is connected to a second voltage $V_{SS}$. The first voltage $V_{DDS}$ has a positive potential in respect to the second voltage $V_{SS}$. A gate G of a transistor 308b is connected to the drains D of the transistors 304b and 306b, and source of the transistor 308b is connected to the first voltage $V_{DDS}$. An output 310b, which is an input of a N-channel MOS transistor (not shown), is taken from the common point of the input 302b, the gates G of transistors 304b and 306b, and the drain D of transistor 308b.

Figure 4:
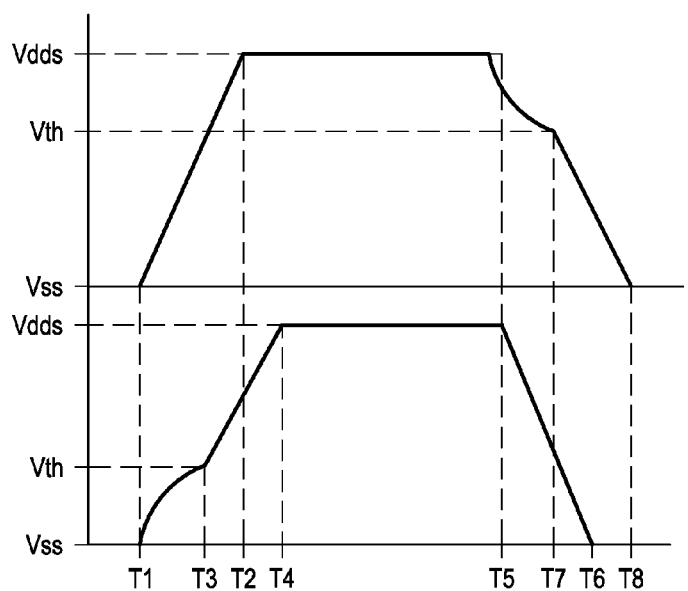
FIG. 4 depicts a timing diagram of the exemplary wave shaping circuitry of FIGS. 3A and 3B.

The operation of the wave shaping circuitry depicted in FIG. 3A is described in reference with FIG. 4, wherein a Voltage is plotted on the vertical axis and a time is plotted on the horizontal axis. Consider the signal at the input to the NAND and NOR circuits transitioning from a low voltage level to a high voltage level (not shown).

The output of the NAND circuit will transition from a low voltage, e.g., $V_{SS}$ to a high voltage level, e.g., $V_{DDS}$ (not shown). This transition appearing at the input 302a will be processed by the wave shaping circuitry in FIG. 3A and will appear at time $t_1$ as a transition from the voltage $V_{SS}$ to the voltage $V_{DDS}$ at time $t_2$, at the output 310a. As illustrated that transition is very fast because the topology of the NAND circuit, including the selection of (P-channel MOS) transistors comprising the NAND circuit, is designed to provide a drive to the P-channel MOS transistor for a fast turn off. The topology of the wave shaping circuitry, including the selection of the transistors, is designed to have negligible or no effect on the rise transition.

Thus the transition rise time can be characterized by a rate of change having a single value determined as $(V_{DDS\_SV} - V_{SS\_SV})/(t_2 - L_1)$, where $V_{DDS\_SV}$ is a specified value of $V_{DDS}$ and $V_{SS\_SV}$ is a specified value of $V_{SS}$. By means of example, the $V_{DDS\_SV}$ may be 10% and $V_{SS\_SV}$ may be 90% of the difference between the $V_{DDS}$ and the $V_{SS}$. However, other values may be used without a loss of generality.

The output of the NOR circuit will transition from a low voltage, e.g., $V_{SS}$ to a high voltage level, e.g., $V_{DDS}$ (not shown). This transition appearing at the input 302b will be processed by the wave shaping circuitry in FIG. 3B, and will appear at time $t_1$ as a transition 404 from voltage $V_{SS}$ to a threshold voltage $V_{th}$ of the N-channel MOS transistor (not shown) at the output 310b. The shape of the transition is due to gate capacitances of the transistors 304b, 306b, and 308b. At time $t_3$, the effect due to gate capacitances diminishes as the capacitances are charged and the transition proceeds at a faster rate from the threshold voltage $V_{th}$ to the a high voltage $V_{DDS}$, reached at time $t_4$.

Thus the transition rise time can be characterized by two rates of change. The first rate of change having a value determined as $(V_{th\_SV}-V_{SS\_SV})/(t_3-t_1)$; where $V_{SS\_SV}$ is a specified value of $V_{SS}$ and $V_{th\_SV}$ is a specified value of $V_{th}$. By means of example, the $V_{DDS\_SV}$ may be 10% and $V_{th\_SV}$ may be 90% of the difference between the $V_{th}$ and the $V_{SS}$. However, other values may be used without a loss of generality. The second rate of change having a value determined as $(V_{DDS\_SV}-V_{th\_SV})/(t_4-t_3)$, where $V_{DDS\_SV}$ is a specified value of $V_{DDS}$ and $V_{th\_SV}$ is a specified value of $V_{th}$. By means of example, the $V_{th\_SV}$ may be 10% and $V_{DDS\_SV}$ may be 90% of the difference between the $V_{DDS}$ and the $V_{th}$. However, other values may be used without a loss of generality.

As discussed above, the Icrowbar flows through the P-channel MOS and N-channel MOS output transistors only during a short time interval when both transistors are on, i.e., between $t_1$ and $t_3$.

After a period of time, the signal at the input to the NAND and NOR circuits will transition from the high voltage level to the low voltage level (not shown).

The output of the NOR circuit will transition from the high voltage level $V_{DDS}$ at time to the low voltage level $V_{SS}$. This transition appearing at the input 302b will be processed by the wave shaping circuitry in FIG. 3B and will appear at time $t_5$ as a transition from the voltage $V_{SS}$ to the voltage $V_{DDS}$ at time $t_6$, at the output 310b. As illustrated that transition is very fast because the topology of the NOR circuit, including the selection of (N-channel MOS) transistors comprising the NOR circuit, is designed to provide a drive to the N-channel MOS transistor for a fast turn off. The topology of the wave shaping circuitry, including the selection of the transistors, is designed to have negligible or no effect on the rise transition.

Thus the transition fall time can be characterized by a rate of change having a single value determined as $(V_{DDS\_SV}-V_{DDS\_SV})/(t_6-t_5)$; where $V_{DDS\_SV}$ is a specified value of $V_{DDS}$ and $V_{SS\_SV}$ is a specified value of $V_{SS}$. By means of example the $V_{DDS\_SV}$ may be 10% and $V_{SS\_SV}$ may be 90% of the difference between the $V_{DDS}$ and the $V_{SS}$. However, other values may be used without a loss of generality.

The output of the NAND circuit will transition from the voltage $V_{SS}$ to the voltage level $V_{DDS}$. This transition appearing at the input 302a will be processed by the wave shaping circuitry in FIG. 3A, and will appear at time $t_5$ as a transition from the voltage $V_{SS}$ to the threshold voltage $V_{th}$ of the P-channel MOS transistor at the output 310a. The shape of the transition is due to gate capacitances of the transistors 304a, 306a, and 308a. At time $t_7$, the effect due to gate capacitances diminishes as the capacitances are charged and the transition proceeds at a faster rate form the threshold voltage $V_{th}$ to the a voltage $V_{DDS}$, reached at time $t_8$.

Thus the transition fall time can be characterized by two rates of change. The first rate of change having a value determined as $(V_{DDS\_SV}-V_{th\_SV})/(t_7-t_5)$; where $V_{DDS\_SV}$ is a specified value of $V_{DDS}$ and $V_{th\_SV}$ is a specified value of $V_{th}$. By means of example, the $V_{DDS\_SV}$ may be 10% and $V_{th\_SV}$ may be 90% of the difference between the $V_{th}$ and the $V_{DDS}$. However, other values may be used without a loss of generality. The second rate of change having a value determined as $(V_{th\_SV}-V_{SS\_SV})/(t_8-t_7)$; where $V_{SS\_SV}$ is a specified value of $V_{SS}$ and $V_{th\_SV}$ is a specified value of $V_{th}$. By means of example the $V_{th\_SV}$ may be 10% and $V_{DDS\_SV}$ may be 90% of the difference between the $V_{SS}$ and the $V_{th}$. However, other values may be used without a loss of generality.

As understood from the above, the decrease of Icrowbar and di/dt is accomplished by delaying a turn on of one output transistor with respect to a turn off the other output transistor. This is accomplished by shaping the input pulse train signal alternating between a low level $V_{SS}$ and a high level $V_{DDS}$ by the first wave shaping circuit to provide an output pulse train signal a rising edge of which comprises a raise time characterized by a first rate of change between the low level $V_{SS}$ and a turn off/on level of the driven transistor $V_{th}$ and a second rate of change between the turn off/on level of the driven transistor $V_{th}$ the high level $V_{DDS}$ and shaping the input pulse train signal by the second wave shaping circuit to provide an output pulse train signal a raising edge of which comprises a raise time characterized by a single rate of change between the low level $V_{SS}$ and the high level $V_{DDS}$. Similarly, for the falling edge of the input pulse train signal, the first wave shaping circuit shapes the falling edge so that the fall time is characterized by a single rate of change between the high level $V_{DDS}$ and the low level $V_{SS}$, and the second wave shaping circuit shapes the falling edge so that the fall time is characterized by a first rate of change between the high level $V_{DDS}$ and a turn off/on level of the driven transistor $V_{th}$ and a second rate of change between the turn off/on level of the driven transistor $V_{th}$ the low level $V_{SS}$.

This way, the time interval for which the two transistors are on, i.e., conducting, is decreased; consequently, that Icrowbar and di/dt are likewise decreased. It should therefore be understood that other topologies achieving the functionality are within the scope of this disclosure.

Figure 5A:
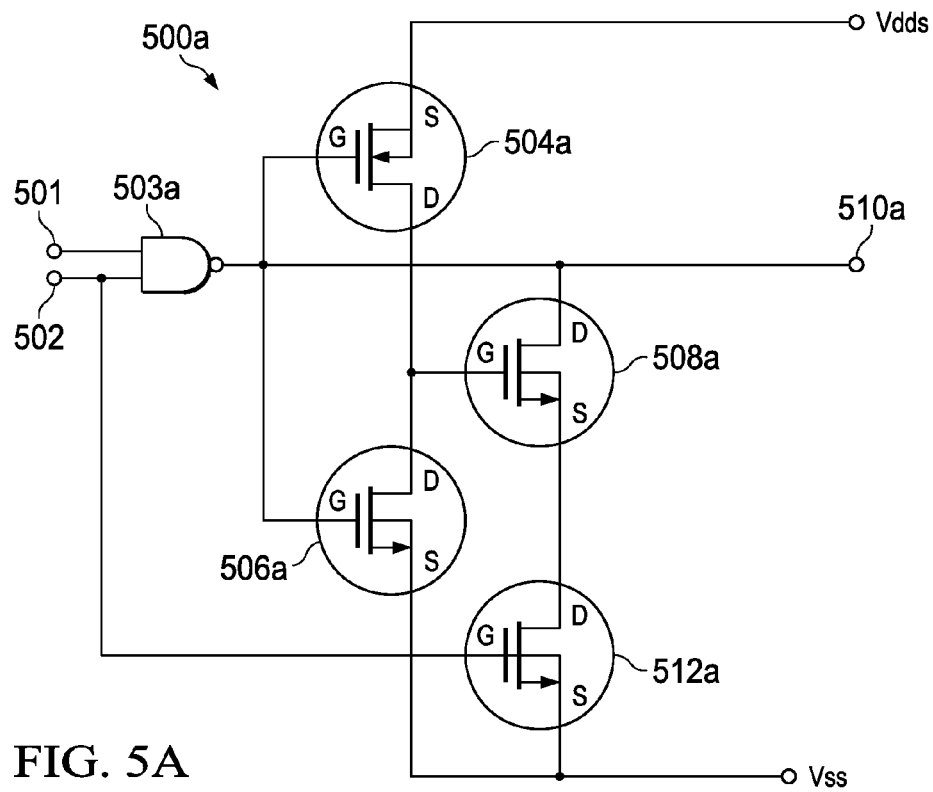
FIG. 5A depicts a conceptual structure of an exemplary wave shaping circuitry interposed between a NAND circuit and a P-channel MOS transistor in accordance with another aspect of this disclosure.

An alternative topology implementing the above-described functionality is depicted in FIG. 5. The topology depicted in FIG. 5 differs from the topology of FIG. 3 in that an additional transistor 512a respective 512b is added to the circuit. Considering FIG. 5A, instead of connecting the source S of the transistor 508a to $V_{SS}$, the source S is connected to a drain D of the transistor 512, and the source S of the transistor 512 is connected to $V_{SS}$. The gate G of the transistor 512 is connected to the signal to be processed 502, which is enabled by a signal 501.

Figure 5B:
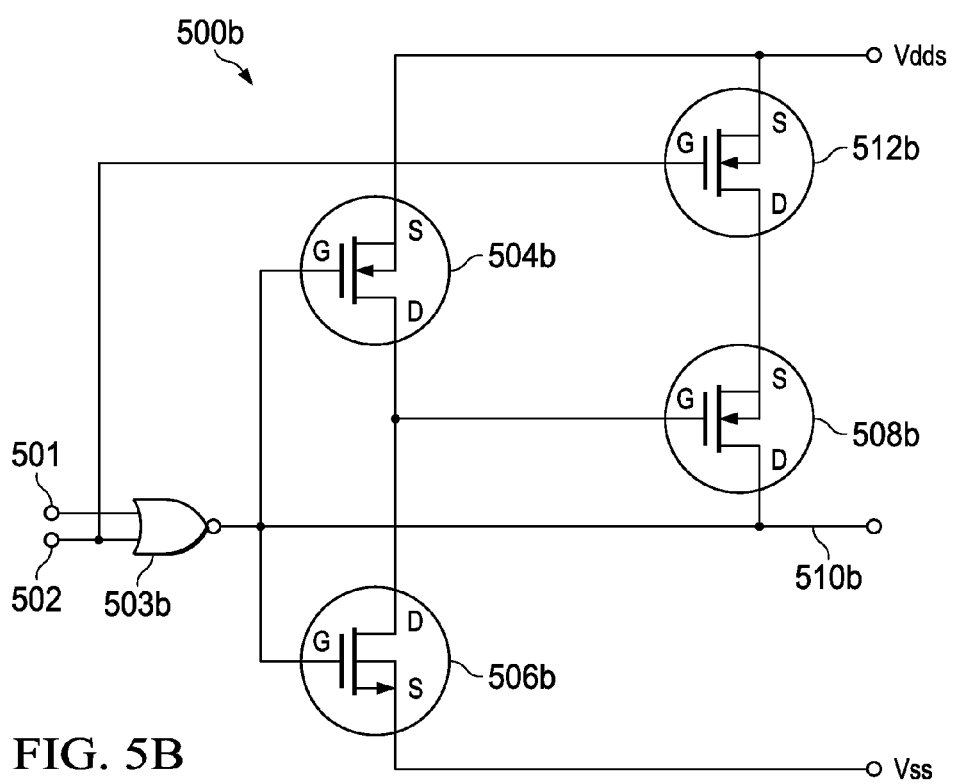
FIG. 5B depicts a conceptual structure of an exemplary wave shaping circuitry interposed between a NOR circuit and an N-channel MOS transistor in accordance with another aspect of this disclosure.

Similarly, considering FIG. 5B, instead of connecting the source S of the transistor 508b to $V_{DDS}$, the source S is connected to a drain D of the transistor 512b, and the source S of the transistor 512b is connected to $V_{DDS}$. The gate of the transistor 512b is connected to the signal to be processed 502, which is enabled by a signal 501.

The above configuration further decreases the Icrowbar due to the fact that in addition to the topology comprising transistors 504, 506 and 508, being driven by the pre-driver, i.e., the NAND circuit 503a respective NOR circuit 503b), the transistor 512a is directly driven by 502. Thus, considering FIG. 5A the signal 502 transitioning from a high voltage level to a low voltage level ensures turn off of the wave shaping circuitry faster since the transistor 512a is directly driven by signal 502. Similarly, considering FIG. 5B the signal 502 transitioning from a low voltage level to a high voltage level ensures turnoff of the wave shaping circuit faster since the transistor 512b is directly driven by signal 502.

A person skilled in the art will appreciate that the different aspects disclosed herein can be combined, as long as the correct timing relationship is satisfied. Thus, by means of an example, the wave shaping circuitry disclosed in FIG. 3A may be combined with the wave shaping circuitry disclosed in FIG. 3B or the wave shaping circuitry disclosed in FIG. 5B. Similarly, the wave shaping circuitry disclosed in FIG. 3B may be combined with the wave shaping circuitry disclosed in FIG. 5A.

Although the invention has been described and illustrated with a certain degree of particularity, it should be understood that the present disclosure has been made by way of example only, and that numerous changes in the combination and arrangement of parts may be resorted to without departing from the spirit and scope of the invention, as hereinafter claimed.

The invention claimed is:

1. A wave shaping apparatus comprising:
   a first circuit configured to receive an input pulse train signal alternating between a low level and a high level and to provide a first output pulse train signal comprising a first raise time characterized by a first rate of change between the low level and a first intermediate level and a second rate of change between the first intermediate level and the high level, and
   a first fall time characterized by a third rate of change between the high level and the low level; and
   a second circuit configured to receive the input pulse train signal and to provide a second output pulse train signal comprising
      a second rise time characterized by a fourth rate of change between the low level and the high level, and
      a second fall time characterized by a fifth rate of change between the high level and a second intermediate level and a sixth rate of change between the second intermediate level and the low level.

2. The wave shaping apparatus as claimed in claim 1 wherein the first rate of change is lower than the second rate of change; and the fifth rate of change is lower than the sixth rate of change.

3. The wave shaping apparatus as claimed in claim 1 wherein the first circuit comprises:
   a first voltage node;
   a second voltage node;
   a first input node;
   an output node connected to the first input node;
   a first transistor a gate of which is connected to the first input node, a source of which is connected to the first voltage node, a drain of which is connected to an intermediate node;
   a second transistor a gate of which is connected to the first input node, a source of which is connected to the second voltage node, a drain of which is connected to the intermediate node; and
   a third transistor a gate of which is connected to the intermediate node, a source of which is connected to the second voltage node, a drain of which is connected to the output node.

4. The wave shaping apparatus as claimed in claim 3 wherein the first circuit further comprises:
   a second input node;
   a fourth transistor a gate of which is connected to the second input node, a source of which is connected to the second voltage node, and a drain of which is connected to the source of the third transistor which is disconnected from the second voltage node.

5. The wave shaping apparatus as claimed in claim 4 wherein the input pulse train signal is provided to the first input node and to the second input node.

6. The wave shaping apparatus as claimed in claim 3, wherein the first voltage node is positive in respect to the second voltage node.

7. The wave shaping apparatus as claimed in claim 1 wherein the second circuit comprises:
   a first voltage node;
   a second voltage node;
   a first input node;
   an output node connected to the first input node;
   a first transistor a gate of which is connected to the first input node, a source of which is connected to the first voltage node, a drain of which is connected to an intermediate node;
   a second transistor a gate of which is connected to the first input node, a source of which is connected to the second voltage node, a drain of which is connected to the intermediate node; and
   a third transistor a gate of which is connected to the intermediate node, a source of which is connected to the first voltage node, a drain of which is connected to the output node.

8. The wave shaping apparatus as claimed in claim 7 wherein the second circuit further comprises:
   a second input node;
   a fourth transistor a gate of which is connected to the second input node, a source of which is connected to the first voltage node, and a drain of which is connected to the source of the third transistor which is disconnected from the first voltage node.

9. The wave shaping apparatus as claimed in claim 8 wherein the input pulse train signal is provided to the first input node and to the second input node.

10. The wave shaping apparatus as claimed in claim 7, wherein the first voltage node is positive in respect to the second voltage node.

11. A method for wave shaping an input pulse train signal alternating between a low level and a high level comprising:
    processing by a first circuit the input pulse train to produce a first output signal with a first raise time characterized by a first rate of change between the low level and a first intermediate level and a second rate of change between the first intermediate level and the high level and a first fall time characterized by a third rate of change between the high level and the low level; and
    processing at a second circuit the input pulse train to produce a second rise time characterized by a fourth rate of change between the low level and the high level and a second fall time characterized by a fifth rate of change between the high level and a second intermediate level and a sixth rate of change between the second intermediate level and the low level; and wherein the processing at the first circuit and the processing at the second circuit is simultaneous.

12. The method as claimed in claim 11 wherein the first rate of change is lower than the second rate of change; and the fifth rate of change is lower that the sixth rate of change.

13. The method as claimed in claim 11 wherein the processing by a first circuit the input pulse train to produce a first output signal comprises:
    providing the input signal to a gate of a first transistor, a source of which is connected to a first voltage node and a drain of which is connected to an intermediate node, and
    to a gate of a second transistor, a source of which is connected to a second voltage node and a drain of which is connected to the intermediate node; and
    providing the output signal from a drain of a third transistor a gate of which is connected to the intermediate node a source of which is connected to a second voltage node.

14. The method as claimed in claim 13 wherein the processing by a first circuit the input pulse train to produce a first output signal further comprises:
    providing the input signal to a gate of a fourth transistor, which is connected to the second input node and a source of which is connected to the first voltage node and a drain of which is connected to the source of the third transistor which is disconnected from the first voltage node.

15. The method as claimed in claim 13, wherein the first voltage node is positive in respect to the second voltage node.

16. The method as claimed in claim 11 wherein the processing by a second circuit the input pulse train to produce a first output signal comprises:
- providing the input signal to a gate of a first transistor, a source of which is connected to the first voltage node and a drain of which is connected to an intermediate node, and
- to a gate of a second transistor, a source of which is connected to a second voltage node and a drain of which is connected to the intermediate node; and
- providing the output signal from a drain of a third transistor a gate of which is connected to the intermediate node and a source of which is connected to a first voltage node.

17. The method as claimed in claim 16 wherein the processing by a second circuit the input pulse train to produce a first output signal further comprises:
- providing the input signal to a gate of a fourth transistor, which is connected to the second input node, a source of which is connected to the first voltage node, and a drain of which is connected to the source of the third transistor which is disconnected from the first voltage node.

18. The method as claimed in claim 16, wherein the first voltage node is positive in respect to the second voltage node.

* * * * *